United States Patent [19]
Carlomagno

[11] Patent Number: 4,685,025
[45] Date of Patent: Aug. 4, 1987

[54] CONDUCTIVE POLYMER CIRCUIT PROTECTION DEVICES HAVING IMPROVED ELECTRODES

[75] Inventor: William D. Carlomagno, Redwood City, Calif.

[73] Assignee: Raychem Corporation, Menlo Park, Calif.

[21] Appl. No.: 711,790

[22] Filed: Mar. 14, 1985

[51] Int. Cl.[4] .................. H02H 5/04; H01C 10/16
[52] U.S. Cl. .................................. 361/106; 361/103; 338/22 R; 338/316
[58] Field of Search ............ 361/103, 106, 405; 338/22 R, 22 SD, 23, 316; 219/541

[56] References Cited

U.S. PATENT DOCUMENTS

| | | | |
|---|---|---|---|
| 3,793,604 | 2/1974 | Duggan et al. | 338/22 R |
| 4,318,073 | 3/1982 | Rossler, Jr. et al. | 338/22 R X |
| 4,331,860 | 5/1982 | Roller et al. | 219/541 X |
| 4,352,083 | 9/1982 | Middleman et al. | 338/23 |
| 4,357,590 | 12/1982 | Belhomme | 338/22 R X |
| 4,413,301 | 11/1983 | Middleman et al. | 361/106 |
| 4,481,498 | 12/1984 | McTavish et al. | 361/106 X |
| 4,504,817 | 3/1985 | Shikama et al. | 338/23 |

FOREIGN PATENT DOCUMENTS 2075319  11/1981  United Kingdom ............... 219/541

Primary Examiner—A. D. Pellinen
Assistant Examiner—A. Jonathan Wysocki
Attorney, Agent, or Firm—Timothy H. P. Richardson; Herbert G. Burkard

[57] ABSTRACT

Circuit protection devices which contain PTC conductive polymer elements and which are used in situations in which the device is mounted onto, or itself comprises, a rigid wall which is spaced apart from the PTC element and through which the electrodes pass. The behavior of the device can be adversely affected if the electrodes, which are prevented from moving by the rigid wall, prevent the PTC element from expanding to the extent necessary to provide the desired PTC effect. The invention includes the use of specially designed electrodes which lessen the danger that the PTC element, when it is tripped, is prevented from expanding to the extent necessary for effective operation.

21 Claims, 9 Drawing Figures

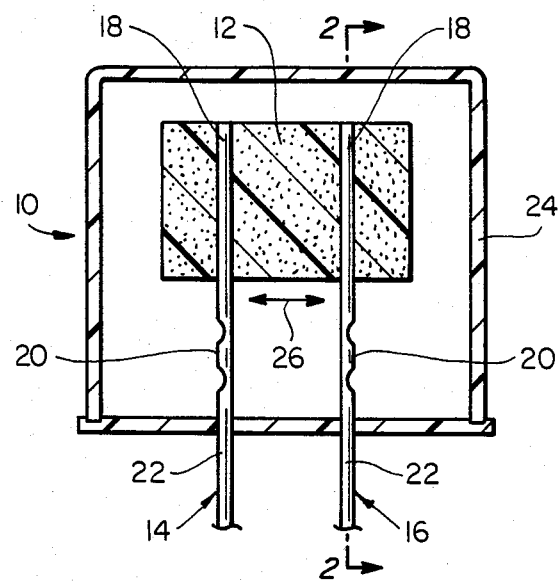
FIG_1
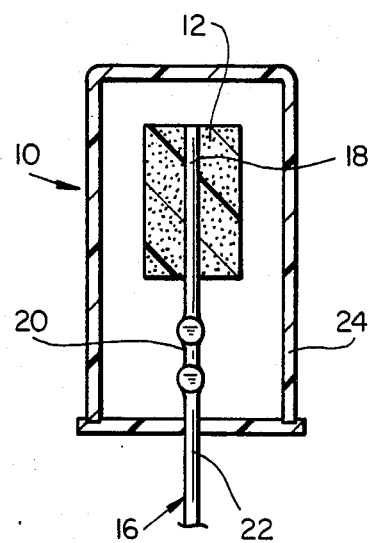
FIG_2

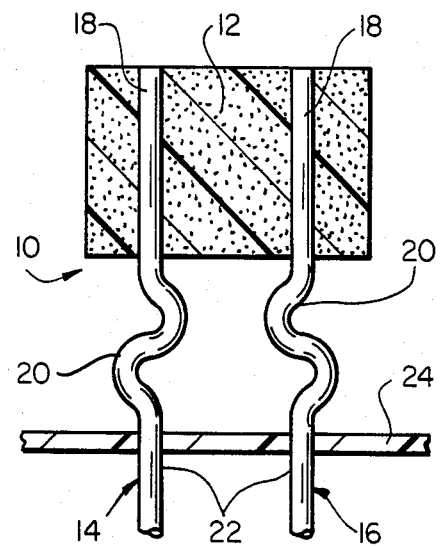
FIG_3
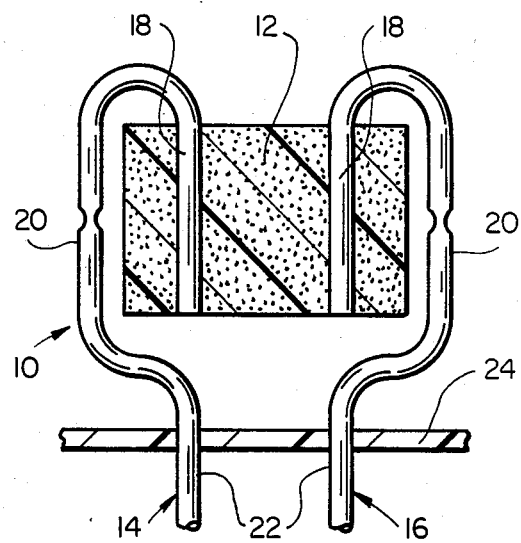
FIG_4

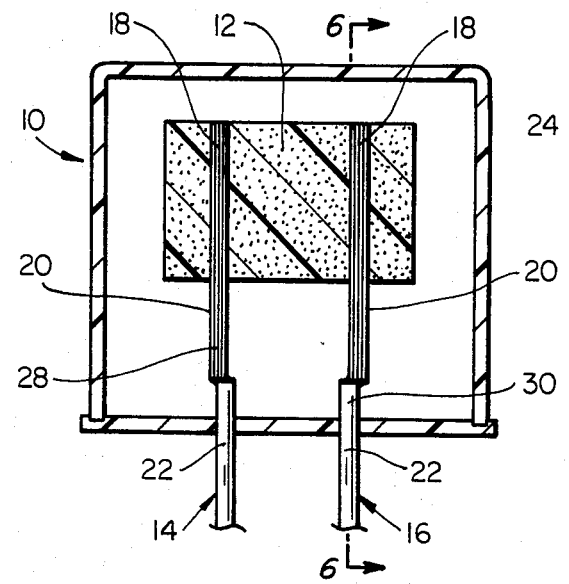
FIG_5
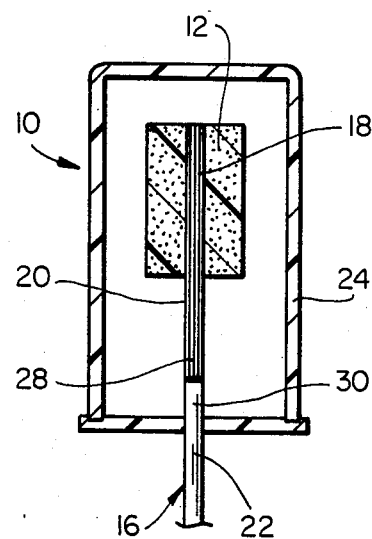
FIG_6

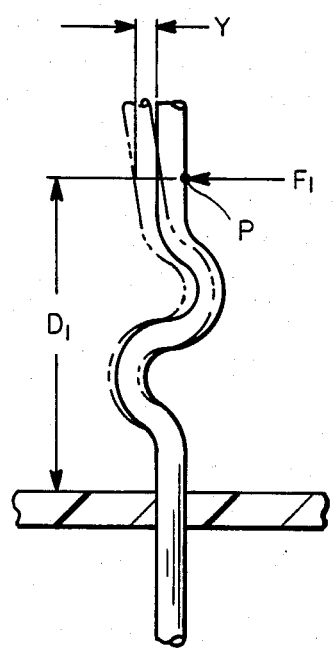
FIG_7
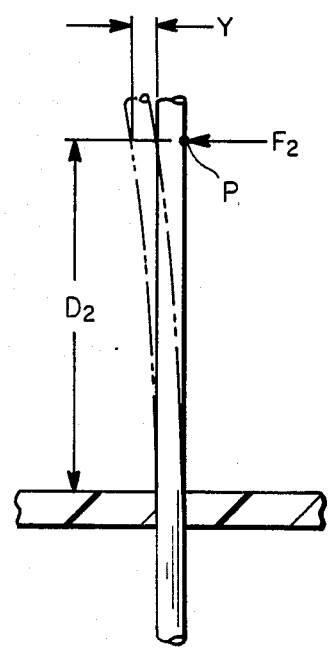
FIG_8
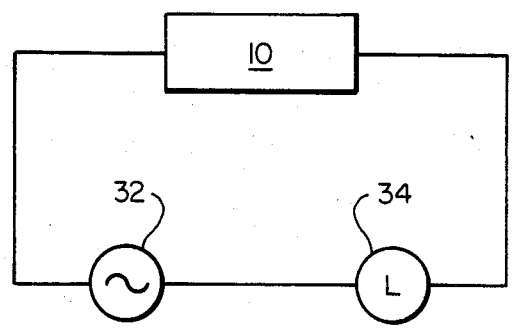
FIG_9

CONDUCTIVE POLYMER CIRCUIT PROTECTION DEVICES HAVING IMPROVED ELECTRODES

BACKGROUND OF THE INVENTION

This invention relates to circuit protection devices comprising a PTC element composed of a conductive polymer element.

INTRODUCTION TO THE INVENTION

Conductive polymer compositions exhibiting PTC behavior, and electrical devices comprising them, are well known.

Particularly useful devices comprising PTC conductive polymers are circuit protection devices. Such devices have a relatively low resistance under the normal operating conditions of the circuit, but are "tripped", i.e., converted into a high resistance state, when a fault condition, e.g., excessive current or temperature, occurs. When the device is tripped by excessive current, the current passing through the PTC element causes it to self-heat to its switching temperature, $T_s$, at which it is in a high resistance state. The increase in resistance is accompanied by an expansion of the PTC element along an axis of expansion. Such devices, and PTC conductive polymer compositions for use in them, are described for example in U.S. Pat. Nos. 4,352,083, 4,413,301 and 4,481,498, and in the commonly assigned patent applications filed contemporaneously with this application by, by Ratell, Ser. Nos. 711,907 and 711,908. The disclosure of each of these patents and pending applications is incorporated herein by reference.

SUMMARY OF THE INVENTION

I have been working on the use of circuit protection devices containing PTC conductive polymer elements in situations in which the device is mounted onto, or itself comprises, a rigid wall which is spaced apart from the PTC element and through which the electrodes pass. In my work, I have discovered that the behavior of the device can be adversely affected if the electrodes, which are prevented from moving by the rigid wall, prevent the PTC element from expanding to the extent necessary to provide the desired PTC effect. These adverse effects, in extreme cases, can cause the PTC element to shatter explosively when subjected to conditions which, if the electrodes are not restrained by the rigid wall, will cause the device to trip in a controlled and predetermined way. The danger of encountering such adverse effects appears to increase as the distance between the PTC element and the rigid wall decreases (which is often highly desirable so that the device occupies as little space as possible) and as the voltage applied to the device increases. In its broadest aspect, this invention includes any novel means which lessens the danger that the PTC element, when it is tripped, is prevented from expanding to the extent necessary for effective operation by restraining forces exerted on it by the electrodes. The most convenient method of ensuring that excessive restraining forces are not applied to the PTC element through the electrodes is by selection of suitable electrodes, bearing in mind that the electrodes must not only be sufficiently flexible to avoid restraining the PTC element, but must in some cases have end portions (remote from the PTC element) which meet end use requirements such as termination to a circuit board or other physical and/or electrical connection device, as well as having the required current-carrying and heat-dissipating characteristics. Another expedient for achieving the desired result is the use of a wall (through which the electrodes pass) which will accommodate the expansive forces of the PTC element.

BRIEF DESCRIPTION OF THE DRAWING

The invention is illustrated in the accompanying drawing, in which

FIG. 1 is a cross-section through a device of the invention in which round leads have been rendered more flexible by deforming them into a doubled dimpled configuration which introduces areas of reduced section moduli;

FIG. 2 is a cross-section on line 2—2 of FIG. 1;

FIG. 3 is a cross-section through another device of the invention in which the round electrodes are rendered more flexible by providing them with an S shaped configuration;

FIG. 4 is a cross-section through another device of the invention in which the round electrodes are rendered more flexible by having both a looped and dimpled configuration;

FIG. 5 is a cross-section through another device of the invention in which each of the electrodes comprises a stranded wire portion adjacent the PTC element and a solid wire portion remote from the PTC element;

FIG. 6 is a cross-section on line 6—6 of FIG. 5;

FIGS. 7 and 8 illustrate the determination of the bending resistance of the inner and outer portions of an electrode; and, FIG. 9 is a circuit diagram for a circuit of the invention.

DETAILED DESCRIPTION OF THE INVENTION

As noted above, the objects of the present invention are preferably achieved through the use of suitable electrodes, and the invention will chiefly be described by reference to this embodiment of the invention. Thus in a preferred aspect, this invention provides A circuit protection device which comprises (1) a PTC element composed of a conductive polymer composition which exhibits PTC behavior and which comprises a polymeric component and, dispersed in the polymeric component, a particulate conductive filler; and (2) two electrodes which are electrically connected to the PTC element and which are connectable to a source of electrical power to cause current to pass through the PTC element and thus to cause the PTC element to self-heat to a switching temperature $T_s$ and to expand along an axis of expansion, thus generating expansion forces which are transmitted to the electrodes;

at least on of said electrodes comprising (a) a first portion which is in physical contact with the PTC element either directly, or indirectly through an element composed of a conductive polymer, (b) a second inner portion which is not in contact with the PTC element or with any other solid element, and (c) a third outer portion which is not in contact with the PTC element;

the inner portion lying between the first portion and the outer portion, and having a resistance to bending, parallel to the axis of expansion of the PTC element, which is less than the resistance to bending, parallel to the axis of expansion of the PTC element, of the outer portion.

In this preferred embodiment of the invention, the inner portion has a lower resistance to bending than the outer portion, when subjected to forces parallel to the axis of expansion of the PTC element. The inner portion has a resistance to bending which is preferably less than 0.9, particularly less than 0.75, for example, less than 0.5, times the resistance to bending of the outer portion. The term "resistance to bending" is used herein to mean the quantity F/D, where F is the force required to move one end of the portion a distance of 2 mils, in a direction parallel to the axis of expansion of the PTC element, the portion being elastically deformed and the other end of the portion being maintained in a fixed position, and D is the distance between a first line which is parallel to the axis of expansion and which passes through one end of the portion and a second line which is parallel to the axis of expansion and which passes through the other end of the portion.

The two electrodes are generally made of metal and are preferably substantially identical. The first portions of the electrodes are preferably in direct physical contact with the PTC element, but can be separated therefrom by a layer of another conductive material, e.g., a ZTC conductive polymer. The first portions of the electrodes can be of any configuration, e.g., planar sheet electrodes which are contacted by the PTC element on only one surface, or columnar electrodes which are surrounded by the PTC element, particuarly round wires of thin metal strips.

In one embodiment each of the electrodes is composed of a single piece of solid metal which is shaped at one or more sections along its length to provide the second portion of greater flexibility. Especially because of heat dissipation requirements, such electrodes preferably have a substantially constant cross-sectional area. The electrodes are preferably substantially straight and parallel to each other, and especially in that case the second portion is preferably provided by one or more sections in which the cross-sectional dimension parallel to the axis of expansion of the PTC element is less than 0.9, preferably less than 0.8, e.g., less than 0.75, particularly less than 0.5, times the average cross-sectional dimension of the inner portion parallel to the axis of expansion of the PTC element. Alternatively or additionally, the second portion of greater flexibility can be provided by a substantially curved configuration, e.g. an S shape.

In another embodiment, each of the electrodes comprises first and inner portions which are in the form of a single piece of stranded metal wire, and an outer portion which is a solid wire and which is secured to, e.g. welded to, the second portion. The advantage of this embodiment is that the outer portion can be selected for its desired properties for connection to other electrical devices, for which stranded metal wires are often unsatisfactory.

The greater flexibility of the inner portion of the electrodes is especially useful in devices which comprise a rigid wall, e.g. the base of an enclosure which encloses one or more PTC elements, which is spaced apart from the PTC element and which contains two exit ports through each of which passes one of the electrodes. The second, inner portion lies between the wall and the PTC element, and the third, outer portion lies outside the wall.

The devices of the invention are particularly valuable in circuits which operate at relatively high voltages, e.g. 200 volts AC or higher, particulary at least 350 volts AC, especially at least 500 volts AC, e.g. 600 volts AC, or which under normal conditions operate at a lower voltage, e.g. 20 to 60 volts DC, but which may be exposed to much higher voltages, e.g. as described above, during a fault. Thus the present invention has been found to be very valuable in PTC devices for use as secondary protection against voltage spikes and current transients in subscriber loop interface circuits in telecommunication systems.

Referring now to the drawings, FIGS. 1 through 6 shows a means of providing flexibility to the inner portion of the electrodes. In particular, FIGS. 1 and 2 provide cross-sections through a device 10 of the invention. The device 10 includes a PTC element 12 composed of a conductive polymer composition which exhibits PTC behavior, and two electrodes 14 and 16 which are electrically connected to the PTC element. Each of the two electrodes 14 and 16 has a first portion 18 which is in physical contact with the PTC element, a second inner portion 20 which is not in contact with the PTC element, and a third outer portion 22 which is not in contact with the PTC element. Also shown is a rigid wall 24 which is spaced apart from the PTC element and which contains two exit ports through each of which passes one of the electrodes. The axis of expansion of the element 12 is along a line 26. The inner portions 20 of the electrodes are round and have been rendered more flexible by deforming them into a double dimpled configuration, thus introducing areas of reduced section moduli.

FIG. 3 is similiar to FIGS. 1 and 2 and shows the inner portions 20 of the electrodes formed in an S shape. FIG. 4 also is similiar to FIGS. 1 and 2 and shows the inner portion 20 of the electrodes formed in a looped and dimpled configuration.

FIGS. 5 and 6 show an alternative embodiment wherein the inner portions 20 of the electrodes comprise a stranded portion 28 welded to a solid portion 30. Note that the method of attachment i.e. welding, can affect the flexibility of the inner portions 20.

FIGS. 7 and 8 illustrate determination of the bending resistance of the inner and outer portions of the electrodes respectively. Thus in FIG. 7 the lower end of an inner portion is fixed and a force $F_1$ is applied to the upper end of the inner portion at point P; the force $F_1$ is such that P moves a distance Y which is 2 mils; and the distance $D_1$ between the fixed lower end and the point P is measured. The resistance to bending of the first portion, $F_1/D_1$, is then calculated. Similarly in FIG. 8, the lower end of an outer portion is fixed and a force $F_2$ is applied to the upper end of the outer portion at point P; the force $F_2$ is such that P moves a distance Y which is 2 mils; and the distance $D_2$ between the fixed lower end and the point P is measured. The resistance to bending of the outer portion, $F_2/D_2$ is then calculated.

Referring now to FIG. 9, this shows a circuit of the invention comprising a power supply 32, a circuit protection device 10 and an electrical load 34 in series therewith.

I claim:
1. A circuit protection device which comprises
   (1) a PTC element composed of a conductive polymer composition which exhibits PTC behavior and which comprises a polymeric component and, dis- persed in the polymeric component, a particulate conductive filler; and (2) two electrodes which are electrically connected to the PTC element and which are connectable to a source of electrical power to cause current to pass through the PTC element and thus to cause the PTC element to self-heat to a switching temperature $T_s$ and to expand along an axis of expansion, thus generating expansion forces which are transmitted to the electrodes; at least one of said electrodes comprising (a) a first portion which is in physical contact with the PTC element either directly, or indirectly through an element composed of a conductive polymer, (b) a second inner portion which is not in contact with the PTC element or any other solid element, and (c) a third outer portion which is not in contact with the PTC element;

the inner portion lying between the first portion and the outer portion, and having a first resistance to bending, parallel to the axis of expansion of the PTC element, and the outer portion having a second resistance to bending, parallel to the axis of expansion of the PTC element, the first resistance to bending being less than the second resistance to bending, where the first resistance to bending is equal to the quantity $F_1/D_1$, where $F_1$ is the force required to move one end of the inner portion a distance of 2 mils, in a direction parallel to the axis of expansion of the PTC element, the inner portion being elastically deformed and the other end of the inner portion being maintained in a fixed position, and $D_1$ is the distance between a first line which is parallel to the axis of expansion and which passes through one end of the inner portion and a second line which is parallel to the axis of expansion and which passes through the other end of the inner portion; and the second resistance to bending is equal to the quantity $F_2/D_2$, where $F_2$ is the force required to move one end of the outer portion a distance of 2 mils, in a direction parallel to the axis of expansion of the PTC element, the outer portion being elastically deformed and the other end of the outer portion being maintained in a fixed position, and $D_2$ is the distance between a first line which is parallel to the axis of expansion and which passes through one end of the inner portion and a second line which is parallel to the axis of expansion and which passes through the other end of the outer portion.

2. A device according to claim 1 wherein the inner portion has a resistance to bending which is less than 0.9 times the resistance to bending of the outer portion.

3. A device according to claim 2 wherein the inner portion has a resistance to bending which is less than 0.75 times the resistance to bending of the outer portion.

4. A device according to claim 3 wherein the inner portion has a resistance to bending which is less than 0.5 times the resistance to bending of the outer portion.

5. A device according to claim 1 wherein the electrodes are substantially identical and the first portions thereof are in physical contact with the PTC element.

6. A device according to claim 1 wherein the first portions of the electrodes are parallel to each other, are columnar in shape, and are surrounded by the PTC element.

7. A device according to claim 6 wherein the electrodes are substantially identical and the first portions thereof are in physical contact with the PTC element.

8. A device according to claim 7 wherein each of the electrodes is a single piece of solid metal.

9. A device according to claim 8 wherein each of the electrodes has a cross-sectional area which is the same throughout its length, and an inner portion which contains at least one section in which the cross-sectional dimension parallel to the axis of expansion of the PTC element is less than 0.8 times the average cross-sectional dimension of the inner portion parallel to the axis of expansion of the PTC element.

10. A device according to claim 9, wherein the inner portion contains at least one section in which said cross-sectional dimension is less than 0.5 times said average cross-sectional dimension.

11. A device according to claim 10, wherein the inner portion contains at least one section in which said cross-sectional dimension is less than 0.2 times said average cross-sectional dimension.

12. A device according to claim 9 wherein the electrodes are substantially straight and parallel to each other.

13. A device according to claim 8 wherein, in at least one of the electrodes, at least a part of the inner portion is substantially curved.

14. A device according to claim 7 wherein each of the electrodes comprises first and inner portions which are in the form of a single piece of stranded metal wire, and an outer portion which is a solid wire.

15. A device according to claim 1 which comprises a rigid wall which is spaced apart from the PTC element and which contains two exit ports through each of which passes one of the electrodes, and wherein in each of the electrodes, the inner portion lies between the wall and the PTC element and the outer portion lies on the other side of the wall, remote from the PTC element.

16. A device according to claim 15 wherein the rigid wall is part of an enclosure which encloses and is spaced apart from the PTC element.

17. A device according to claim 1 wherein the conductive filler is carbon black.

18. An electrical circuit which comprises (a) a power source having a voltage V which is at least 20 volts DC;

(b) an electrical load; and (c) a circuit protection device which comprises (1) a PTC element composed of a conductive polymer composition which exhibits PTC behavior and which comprises a polymeric component and, dispersed in the polymeric component, a particulate conductive filler; and (2) two electrodes which are electrically connected to the PTC element and which are connected in series to the load and the power source to cause current to pass through the PTC element so that, if an external power source is introduced into the circuit and increases the current through the circuit protection device above a predetermined fault level, the PTC element self-heats to a switching temperature $T_s$ and expands along an axis of expansion, thus generating expansion forces which are transmitted to the electrodes;

at least one of said electrodes comprising (a) a first portion which is in physical contact with the PTC element either directly, or indirectly through an element composed of a conductive polymer, (b) a second inner portion which is not in contact with the PTC element or any other solid element, and (c) a third outer portion which is not in contact with the PTC element;

the inner portion lying between the first portion and the outer portion, and having a first resistance to bending, parallel to the axis of expansion of the PTC element, and the outer portion having a second resistance to bending, parallel to the axis of expansion of the PTC element, the first resistance to bending being less than the second resistance to bending, where the first resistance to bending is equal to the quantity $F_1/D_1$, where $F_1$ is the force required to move one end of the inner portion a distance of 2 mils, in a direction parallel to the axis of expansion of the PTC element, the inner portion being elastically deformed and the other end of the inner portion being maintained in a fixed position, and $D_1$ is the distance between a first line which is parallel to the axis of expansion and which passes through one end of the inner portion and a second line which is parallel to the axis of expansion and which passes through the other end of the inner portion; and the second resistance to bending is equal to the quantity $F_2/D_2$, where $F_2$ is the force required to move one end of the outer portion a distance of 2 mils, in a direction parallel to the axis of expansion of the PTC element, the outer portion being elastically deformed and the other end of the outer portion being maintained in a fixed position, and $D_2$ is the distance between a first line which is parallel to the axis of expansion and which passes through one end of the inner portion and a second line which is parallel to the axis of expansion and which passes through the other end of the outer portion.

19. An electrical circuit according to claim 18, wherein the circuit protection device provides the secondary protection in a subscriber loop interface circuit.

20. An electrical circuit according to claim 18, wherein the electrical load comprises a telecommunication system.

21. An electrical circuit according to claim 18, which is liable to faults a voltages greater than 200 volts AC.

* * * * *